US006725777B2

(12) United States Patent
Katano

(10) Patent No.: US 6,725,777 B2
(45) Date of Patent: Apr. 27, 2004

(54) RECORDING MEDIUM WITH DISPERSED INK ADHERING AND INK RELEASING MATERIALS

(75) Inventor: Yasuo Katano, Tokyo (JP)

(73) Assignee: Ricoh Company Ltd., Tokyo (JP)

( * ) Notice: Subject to any disclaimer, the term of this patent is extended or adjusted under 35 U.S.C. 154(b) by 82 days.

(21) Appl. No.: 10/099,727

(22) Filed: Mar. 15, 2002

(65) Prior Publication Data

US 2002/0189477 A1 Dec. 19, 2002

(30) Foreign Application Priority Data

Mar. 22, 2001 (JP) ....................................... 2001-081891

(51) Int. Cl.$^7$ ............................ B41N 1/14; G03F 7/075

(52) U.S. Cl. ....................... 101/457; 101/467; 101/478; 430/302; 430/303

(58) Field of Search ................................. 101/456, 457, 101/462, 463.1, 467, 478; 430/270.1, 302, 303

(56) References Cited

U.S. PATENT DOCUMENTS

| | | | | | |
|---|---|---|---|---|---|
| 5,175,568 | A | * | 12/1992 | Oyamaguchi et al. | 347/113 |
| 5,177,506 | A | * | 1/1993 | Katano | 347/113 |
| 5,200,762 | A | * | 4/1993 | Katano et al. | 347/221 |
| 5,278,126 | A | * | 1/1994 | Katano et al. | 503/201 |
| 5,335,001 | A | * | 8/1994 | Katano | 347/183 |
| 5,436,642 | A | * | 7/1995 | Oyamaguchi et al. | 347/221 |
| 6,108,021 | A | * | 8/2000 | Morikawa et al. | 347/221 |
| 6,294,313 | B1 | * | 9/2001 | Kobayashi et al. | 430/302 |
| 6,387,588 | B1 | | 5/2002 | Katano et al. | 430/270.1 |

FOREIGN PATENT DOCUMENTS

| | | |
|---|---|---|
| JP | 3178478 | 8/1991 |
| JP | 7314934 | 12/1995 |

* cited by examiner

*Primary Examiner*—Stephen R. Funk
(74) *Attorney, Agent, or Firm*—Cooper & Dunham LLP

(57) ABSTRACT

The recording medium comprises a recording layer. The recording layer has a first material and a second material independently dispersed. The first material has a property that a backward contact angle to a liquid lowers when the material is heated in a state of being in contact with the liquid, and that the value of the backward contact angle recovers when heated in the air. The second material has a polyorgano-siloxane structure.

10 Claims, 3 Drawing Sheets

IMAGE SECTION

BASE SURFACE SECTION

NEGATIVE WRITING

POSITIVE WRITING

RECORDING MEDIUM WITH DISPERSED INK ADHERING AND INK RELEASING MATERIALS

FIELD OF THE INVENTION

The present invention relates to a recording medium comprising a recording layer, on which a liquid adhesive area and a liquid repulsive area are formed and to which a recording agent used as a solution or a dispersant such as liquid ink is applied so as to form an image on the surface of the recording layer.

BACKGROUND OF THE INVENTION

CTP plates have received much attention in recent years. The CTP plates are provided to write data designed and prepared for a printing plate on a computer, in the plate as it is. As the CTP plate, a water-free plate, which requires no moisturizing water, has been considered as one of the candidates for the next generation CTP plates because this plate can be used by users without specific skills for printing. Conventionally, as disclosed in Japanese Patent Application Laid-Open (JP-A) No. 7-314934, those recording media having a silicone resin coating layer as the outermost layer have been proposed as the water-free CTP plate materials. This technique uses silicone resin that exhibits a superior releasability against oil ink, and forms an image section by mechanically destroying and removing a coating film of the silicone resin using laser abrasion. However, this method is simple, but debris of the silicon resin is produced and a cleaning unit which removes the debris from the plate is further required.

The inventors of this invention have proposed a plate (recording medium), in JP-A No. 3-178478, that does not require any processes such as developing process and debris process before and after writing process. Moreover, the inventors of this invention have also proposed a recording medium, in Japanese Patent Application No. 11-102405, in which an oil-absorbing binder resin is contained in a recording layer in an attempt to make the base plate less susceptible to contamination. However, it has been found that the recording layer simply containing the oil-absorbing binder resin makes the ink difficult to adhere to an image section, although it makes the base plate less susceptible to ink contamination.

SUMMARY OF THE INVENTION

It is an object of this invention is to provide a recording medium that makes a base surface less susceptible to ink contamination, and makes it possible to provide a superior adhesive property of the ink to an image section.

According to this invention, the object is achieved by the respective recording mediums as aspects (1) to (6) of this invention as follows.

(1) The recording medium comprises a recording layer including a first material and a second material independently dispersed in the recording layer. The first material has a property that a backward contact angle to a liquid lowers when the material is heated in a state of being in contact with the liquid, and that the value of the backward contact angle recovers when heated in the air. The second material has a polyorgano-siloxane structure.

(2) The recording medium comprises a recording layer including a first material and a second material independently dispersed in the recording layer, and a binder resin.

The first material has a property that a backward contact angle to a liquid lowers when the material is heated in a state of being in contact with the liquid, and that the value of the backward contact angle recovers when heated in the air. The second material has a polyorgano-siloxane structure. The binder resin fixes the first and second material.

(3) The recording medium comprises a recording layer including a first material and a second material independently dispersed in the recording layer, and an oil resistant elastic binder resin. The first material has a property that a backward contact angle to a liquid lowers when the material is heated in a state of being in contact with the liquid, and that the value of the backward contact angle recovers when heated in the air. The second material has a polyorgano-siloxane structure. The oil resistant elastic binder resin fixes the first and second materials.

(4) The recording medium a recording layer including a first material and a second material independently dispersed in the recording layer. The first material has a property that a backward contact angle to a liquid lowers when the material is heated in a state of being in contact with the liquid, and that the value of the backward contact angle recovers when heated in the air. The second material is an oil-state material having a polyorgano-siloxane structure, and the oil-state material is cross-linked after un-cross-linked organo-siloxane is dispersed in the recording layer.

(5) The recording medium comprises a recording layer including a first material and a second material independently dispersed in the recording layer. The first material has a property that a backward contact angle to a liquid lowers when the material is heated in a state of being in contact with the liquid, and that the value of the backward contact angle recovers when heated in the air. The second material has a polyorgano-siloxane structure and is formed of fine particles that are cross-linked to each other after fine particle materials having a preliminarily cross-linked polyorgano-siloxane structure are dispersed in the recording layer.

(6) In the recording medium according to any of the above-mentioned aspects, the first and second materials have a solid content weight ratio in a range of 4/6 to 6/4.

Other objects and features of this invention will become apparent from the following description with reference to the accompanying drawings.

DETAILED DESCRIPTION

Embodiment of recording medium according to the present invention will now be explained in detail while referring to the accompanying drawings.

Figure 1A:
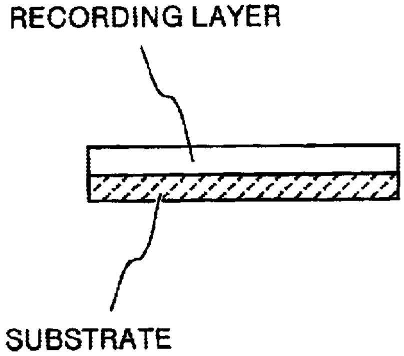
FIG. 1A is a conceptual cross-sectional view that shows the recording medium of the present invention.
Figure 1B:
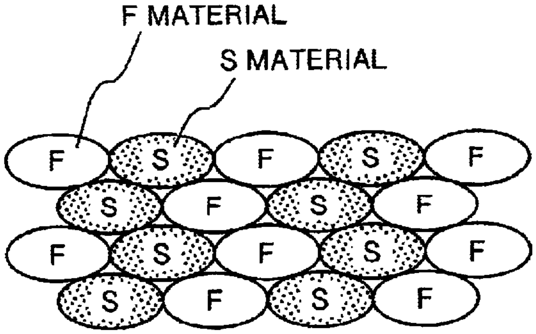
FIG. 1B is a diagram of the recording medium when viewed from the upper side of FIG. 1A, FIG. 2A and FIG. 2B are diagrams for explaining how ink is selectively adhered to a recording layer.
Figure 2A:
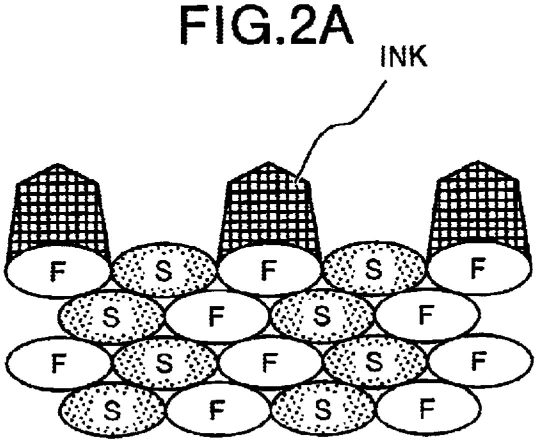
Figure 2B:
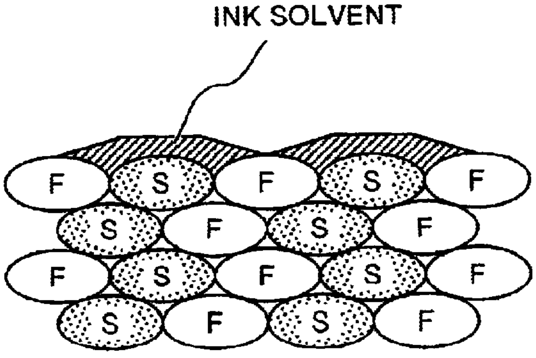

As described above, this invention provides the recording medium comprising a recording layer that includes a first material (hereinafter, referred to as F material) and a second material (S material) maintained in an independently dispersed state. More specifically, the F material has a property that a backward contact angle to a liquid lowers when the material is heated in a contact state with the liquid, while the value of the backward contact angle recovers when heated in the air. The S material has a polyorgano-siloxane structure. FIG. 1A shows a conceptual diagram of the cross section of the recording medium. FIG. 1B shows how the F material and the S material are independently dispersed. The function of allowing the ink to selectively adhere is derived from the property of the F material. The releasability against the ink is derived from the property of the S material. As shown in FIG. 2A, since the backward contact angle of the F material to liquid (including ink) is low in the image section, the ink is adhered to the F material. In contrast, as shown in FIG. 2B, since the backward contact angle of the F material to liquid (including ink) is high on the base surface, the F material repels ink, preventing the ink to adhere to the surface. Moreover, since the S material has a polyorgano-siloxane structure, an ink oil layer as an ultra-thin layer of ink is formed on the S material surface based upon so-called WFBL theory. Therefore, the ink does not directly contact the S material and thereby extremely high ink releasability is exerted. As a result, it is possible to increase the ink releasability with respect to the base surface in comparison with a conventional recording medium using only the F material, and consequently to make the base surface less susceptible to ink contamination.

When the recording layer contains the F material and the ink releasing material, the ink adhesive function in the image section is generally determined by the balance between the F material whose backward contact angle lowers to exhibit a high ink adhesive property and the material exhibiting ink releasability. When the rate of the F material is high, the ink adhesive property increases, and when it is low, the ink is not allowed to adhere. In contrast, the base surface has only the ink releasability as low as the function of the F material used alone, when the rate of the ink releasing material becomes smaller. In other words, the reduction in ink contamination of the base surface and the ink adhesive property to the image section are inversely proportional to each other. The inventors of this invention have studied hard so as to allow these inversely proportional factors to be consistent with each other, and have found that by using the S material as the ink releasing material, it is possible to provide a recording medium that is resistant to ink contamination of the base surface without causing reduction in the ink adhesive property in the image section. Further, it has also been found that these two materials (F material and S material) are preferably dispersed in the recording layer independently from each other.

The F material has a property that a backward contact angle to a liquid lowers when the material is heated in a contact state with the liquid, while the value of the backward contact angle recovers when heated in the air. That is, the F material is (I) an organic compound having a hydrophobic group whose surface has a self alignment function, or (ii) an organic compound having hydrophobic groups that are aligned on the surface.

The "the surface having a self alignment function" described in (i) refers to a function in which when a solid including a certain compound formed on a base material or a solid formed of a compound alone is heated in the air, the hydrophobic groups are aligned on the surface while facing toward the air side (free surface side). This is also true for the case (ii). In general, the organic compound has a property which allows the hydrophobic group to face toward the side of hydrophobic atmosphere. This is a phenomenon that the orientation is achieved so that the surface energy of the solid-gas interface lowers. This phenomenon increases its tendency as the molecular length of the hydrophobic group becomes longer, and this is because the mobility of the molecule caused by heat increases as the molecular length becomes longer.

More specifically, when a molecule has a hydrophobic group at its end (which causes a reduction in the surface energy), the surface alignment tends to be made with the hydrophobic group facing toward the air side (free surface side). In the same manner, when a straight chain molecule has a group $-(CH_2)_n-$ (n is an integer of not less than 12), the portion of the group $-(CH_2)_n-$ has a crystalline property, and therefore the molecule chains tend to be aligned with each other. Moreover, when a molecule has a phenyl group also, the portion of the phenyl group has a flat-face structure, and therefore the molecule chains tend to be aligned with each other. Furthermore, a straight chain molecule containing an element having a high degree of electronegativity, such as fluorine, has a high self-aggregating property, with the result that the molecule chains tend to be aligned with each other.

According to the results of these examinations, a straight chain molecule or a compound containing such a molecule is more preferable. Specifically, this straight chain molecule contains a molecule having a self-aggregating property or a molecule having a flat-face structure, and has a hydrophobic group as its end. The compound containing such a straight chain molecule has a high self-alignment function on the surface.

As clearly shown in the foregoing description, the surface self-alignment function and the backward contact angle are related to each other, and the backward contact angle and the liquid adhesive property are related to each other. In other words, the adhesion of liquid onto a solid surface is mainly generated by tacking of the liquid exerted on the solid surface. This tacking is considered as a kind of frictional force that takes place when a liquid is sliding over a solid surface. Therefore, supposing that the frictional force is $\gamma_f$, the "backward contact angle" θr is represented by the following relational expression ("Japan Adhesive Society Journal" Vol. 22, No. 12, No. 1986, written by Saito, Kitazaki, et al.).

$$\cos\theta r=(\gamma/\gamma_{1v})\cdot(\gamma s-\gamma s_1-\pi e+\gamma_f) \quad (1)$$

(where γ: surface tension of a solid in vacuum $\gamma s_1$: solid-liquid interface tension $\gamma_{1v}$: surface tension at the time when the liquid is in contact with its saturated steam πe: equilibrium surface tension $\gamma_f$: frictional tension γs: surface tension of the solid without an adsorption layer).

Therefore, when the value of θr decreases, the value of $\gamma_f$ increases. In other words, it becomes more difficult for the liquid to slide on the solid surface, thereby causing the liquid to adhere to the surface of the solid.

As assumed from these mutual relationships, the liquid adhesive property varies depending on the degree of the backward contact angle θr, and the backward contact angle θr is determined by using any material having a self-alignment function on its surface. As the printing plate material of this invention, a material having a self-alignment function on its surface is inevitably selected because of necessity of forming a desired pattern area on its surface and/or visualizing the pattern by using a recording agent.

The surface layer of this invention is a layer containing a material has a property that the backward contact angle θr lowers when the material is brought into contact with a liquid in a heating state and the value of the backward contact angle θr recovers when the material is re-heated in the air. In this case, the "liquid" may include a liquid originally existing as a liquid and a solid that becomes a liquid or resultantly generates steam or a liquid at a lowering start temperature of the backward contact angle θr or below. In this case, the steam is defined as steam which results in a liquid on the surface or in the vicinity of the surface of a printing plate with at least one portion thereof having been condensed, and the liquid is allowed to moisten the surface of the printing plate. The solid is defined as a solid that is in a liquid state, or generates a liquid or generates steam at the lowering start temperature of the backward contact angle θr or below. The steam generated from the solid is condensed on the surface or in the vicinity of the surface of the printing plate to generate a liquid.

In addition to water, preferable examples of the liquid include a water solution containing an electrolyte, alcohols such as ethanol and n-butanol, polyhydric alcohols such as glycerin and ethylene glycol, polarized solutions such as ketones including methyl ethyl ketone, straight chain hydrocarbons such as n-nonane and n-octane, cyclic hydrocarbons such as cyclohexane, and non-polarity solutions such as aromatic hydrocarbons including m-xylene and benzene. In particular, the polarized solutions are more preferably used. A mixture of these may be used, or various dispersions and liquid-state ink may be used.

In addition to water vapor, examples of steams that consequently generate liquids include steams from solutions of contact materials, and in particular, steams (including an atomized state) from organic compounds such as ethanol and m-xylene are preferably used. The temperature of the steam of this organic compound is set below the melting point or softening point of a compound forming the surface of the printing plate material.

The solid resulting in a liquid includes compounds containing higher fatty acids, low molecular-weight polyethylene, high molecular gels (such as polyacrylamide gel and polyvinyl alcohol gel), silica gel, or water of crystallization.

A material forming the above-mentioned surface layer is disclosed in, for example, JP-A No. 3-178478, and this material itself has been known. Therefore, it is preferable that the surface layer of this invention is a layer formed of a material containing a hydrophobic polymer having a hydrophobic group, among these known materials. The hydrophobic polymer is preferably constituted by a main chain forming a skeleton and side chains branched from the main chain. A hydrophobic group is preferably contained in the side chain. Moreover, the hydrophobic group and the main chain are preferably bonded to each other directly or through a bonding group.

The hydrophobic group includes groups whose end structures are $—CF_2CH_3$, $—CF_2CF_3$, $—CF(CF_3)_2$, $—C(CF_3)_3$, $—CF_2H$, or $—CFH_2$. Moreover, the hydrophobic group preferably has a crystalline melting point, and therefore the groups having a long carbon chain are preferable, and those having not less than 4 carbon atoms are more preferable. As the hydrophobic group, a polyfluoroalkyl group (hereinafter, referred to as $R^f$ group) having not less than 2 hydrogen atoms of the alkyl group replaced by fluorine atoms is preferable. In particular, an $R^f$ group having carbon atoms of 4 to 20 is preferable, and most of all, an $R^f$ group having carbon atoms of 6 to 12 is more preferable. Although the $R^f$ group may have either a straight chain structure or a branched chain structure, the straight chain structure is more preferable.

Furthermore, as the hydrophobic group, a perfluoroalkyl group having virtually all hydrogen atoms of the alkyl group replaced by fluorine atoms is preferably used. As the perfluoroalkyl group, a group represented by $C_nF_{2n+1}—$ (where n is an integer of 4 to 16) is preferable, and in particular, the group having n represented by an integer of 6 to 12 is more preferable. The perfluoroalkyl group may have either a straight chain structure or a branched chain structure. However, the straight chain structure is more preferable.

Specific examples of the $R^f$ group includes the following groups:

$C_4F_9—$ (any one of structural isomers, such as $CF_3(CF_2)_3—$, $(CF_3)_2CFCF_2—$, $(CF_3)_3C—$, and $CF_3CF_2CF(CF_3)—$), $C_5F_{11}—$ (for example, $CF_3(CF_2)_4—$), $C_6F_{13}—$ (for example, $CF_3(CF_2)_5—$), $C_7F_{15}—$ (for example, $CF_3(CF_2)_6—$), $C_8F_{17}—$ (for example, $CF_3(CF_2)_7—$), $C_9F_{19}—$ (for example, $CF_3(CF_2)_8—$), $C_{10}F_{21}—$ (for example, $CF_3(CF_2)_9—$), and $CHF_2(CF_2)_m—$ (where m is an integer of 1 to 15).

As the surface layer, a layer containing a polymer having an $R^f$ group as a hydrophobic group is preferable. As the polymer having an $R^f$ group, a polymer containing a polymer unit of $R^f$-group-containing (metha)acrylate is preferable. The $R^f$-group-containing (metha)acrylate refers to a compound containing an $R^f$ group in an alcohol residue of acrylic acid or methacrylic acid. In the present specification, acrylate and methacrylate are generally referred to as (metha)acrylate.

As a polymer containing a polymer unit of $R^f$-group-containing (metha)acrylate, the polymer unit of $R^f$-group-containing (metha)acrylate may be one or more kinds. When the polymer unit is two or more kinds, it is preferable that two or more kinds of $R^f$-group-containing (metha)acrylate with $R^f$ groups having different numbers of carbon atoms are used.

As the polymer containing a polymer unit of $R^f$-group-containing (metha)acrylate, a homopolymer of $R^f$-group-containing (metha)acrylate or a copolymer formed by copolymerizing a polymer unit of $R^f$-group-containing (metha)acrylate and a polymerizable monomer other than $R^f$-group-containing (metha)acrylate (hereinafter, polymerizable monomer other than $R^f$-group-containing (metha)acrylate is referred to as comonomer) is preferably used. By using the comonomer, it is possible to adjust the fluorine content of the polymer and the performances thereof. The comonomer is preferably selected from compounds having a radical polymerizable non-saturated bonding group, and one or more kinds of the compounds may be used.

The comonomer includes, vinyl chloride, stearyl(metha)acrylate, ethylene, vinylacetate, vinylfluoride, styrenehalide, α-methylstyrene, p-methylstyrene, (metha)acrylic acid and its alkylester, poly(oxyalkylene)(metha)acrylate, (metha)acrylamide, diacetone(metha)acrylamide, methylolated (metha)acrylamide, N-methylol(metha)acrylamide, alkylvinylether, (halogenated alkyl)vinylether, alkylvinylketone, butadiene, isoprene, chloroprene, glycidyl (metha)acrylate, aziridinyl(metha)acrylate, benzyl(metha) acrylate, isocyanateethyl(metha)acrylate, cyclohexyl (metha)acrylate, 2-ethylhexyl(metha)acrylate, maleic anhydride, (metha)acrylate having a polydimethylsiloxane portion, and N-vinyl carbazole. As the comonomer, vinylchloride and stearylacrylate are preferable. The amount of comonomer is preferably set to 20 to 80 weight % in the copolymer.

These F materials are described in JP-A No. 3-178478. More preferable $R^f$-group-containing (metha)acrylate includes compounds represented by the following formula 1, and those having carbon atoms of not less than 6 in a perfluoroalkyl group that is a side chain are preferable.

Formula 1:

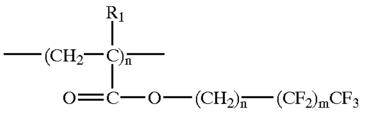

As disclosed in the following formula 2, the S material has a polyorgano-siloxane structure. Wherein, $R_1$, $R_2$ represent alkyl groups. Moreover, instead of these alkyl groups, phenol-modified, epoxy-modified or amino-modified structures may be used.

Formula 2:

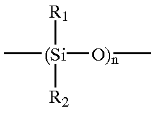

It is preferable for these F material and S material to be independently dispersed, and the size of each domain is preferably set to approximately 1 μm to 5 μm. When the domain is smaller than 1 μm, ink is not easily adhered to the F material in the image section, and the domain of not less than 5 μm causes degradation in the ink releasability on the base surface.

The above-mentioned recording layer is generally formed on a film substrate.

The film substrate in this invention includes known synthetic resin films. The synthetic resin films include polyester film, polycarbonate film, triacetyl cellulose film, cellophane film, polyamide film, polyphenylene sulfide film, polyether imide film, aromatic polyamide film, polysulfone film and polyolefin film. Among these, from the viewpoint of mechanical property, thermal property and costs, the polyester film and polyphenylene sulfide film are preferable, and in particular, the polyester film is more preferable.

The above-mentioned "polyester film" generally refers to the polyester film having an ester bond as its main bonding chain of the main chain.

Polyester includes polyethylene terephthalate, polyethylene 2,6-naphthalate, polyethylene α, β-bis(2-chlorophenoxy) ethane 4,4'-dicarboxylate, and polybutylene terephthalate. From the viewpoint of quality, and costs, polyethylene terephthalate is particularly preferable.

The surface of the film substrate may be left as it is. However, the surface is preferably roughened in this invention. The roughening method is not particularly limited. For example, any of the following processing may be used, that is, sand mat processing of grinding the film surface through sandblasting, direct mat processing of preliminarily mixing fine particles in the film, and coating mat processing of coating the film surface with a resin layer having mixed fine particles. The shape of the film substrate may be any of belt shape, plate shape and drum shape, and selection is made according to the application of the device. The thickness of the film substrate is preferably set to 10 to 200 μm, and is more preferably set to 20 to 100 μm from the viewpoint of costs.

Figure 3A:
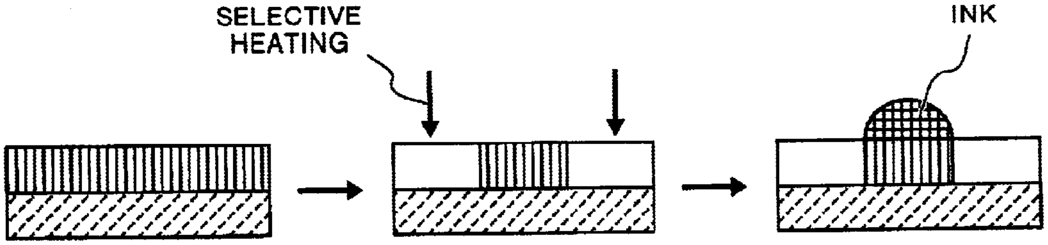
FIG. 3A and FIG. 3B are diagrams for explaining how an image forming process is carried out by using the recording medium.
Figure 3B:
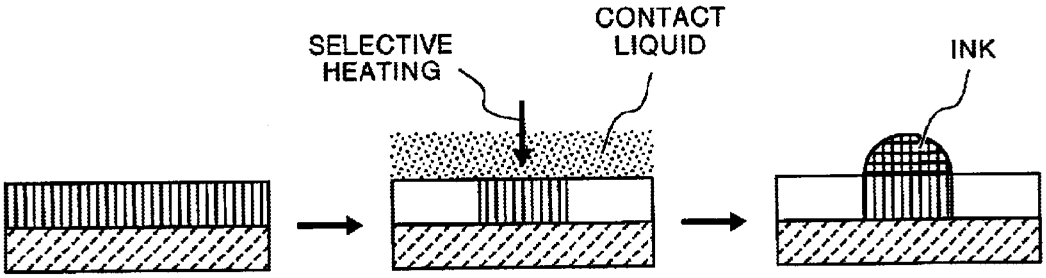

FIG. 3A and FIG. 3B show an image forming method by using this recording medium.

As shown in FIG. 3A, a heating process is preliminarily carried out with the entire surface of a recording layer in contact with a liquid so as to set the entire surface of the recording layer in an ink-adhesive state. Thereafter, upon writing an image, only the non-image section (base surface section) is heated in the air to form a latent image. Then, ink is adhered to the image section by using an inking roller bearing the ink adhered thereto, thereby transferring the image on a sheet of paper.

On the other hand, in FIG. 3B, with the ink releasability being maintained in the initial state, only the image section is selectively heated in a state where the layer is in contact with the liquid. Thus, the image section exhibits an ink adhesive property, making it possible to carry out an image formation.

As the heating source, a contact-type heating device such as a thermal head or a non-contact-type heating source such as a laser is preferably used. As the ink, oil ink is preferably used because the oil ink exhibits a superior releasability to polyorgano-siloxane serving as the S material. As the image recording device, a device capable of printing by using high viscosity ink, such as an offset printing machine and a relief duplicator, is preferably used. The viscosity of the ink is preferably set to approximately 10 Pa·s to 300 Pa·s.

As explained in the aspect (1) of this invention, since the S material absorbs ink solvent at the time of inking, it slightly swells. Therefore, the recording layer coat film is softened, with the result that the coat film might be damaged due to mechanical influences such as friction. In order to prevent this, the strength of the coat film needs to be reinforced. Therefore, as shown in the aspect (2) of this invention, it is preferable that the recording layer contains the F material and the S material in independently separated states, and contains a binder resin so as to fix these materials F and S.

Figure 4A:
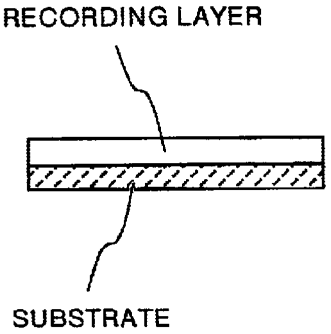
FIG. 4A is a conceptual cross-sectional view that shows another recording medium of the present invention.
Figure 4B:
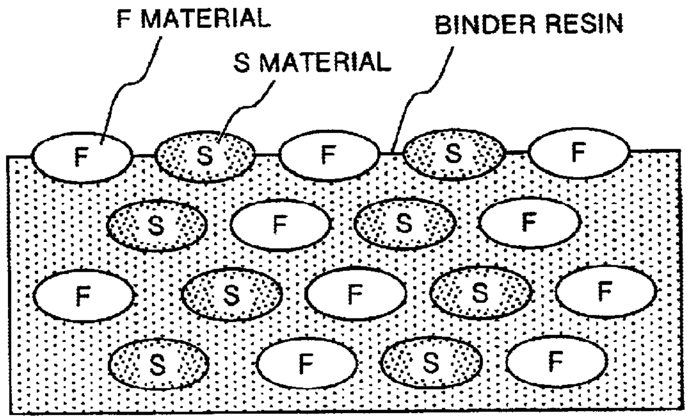
FIG. 4B is a diagram of the recording medium when viewed from the upper side of FIG. 4A, and FIG. 5A and FIG. 5B are diagrams that show coat-film forming processes according to still another recording medium of the present invention.

FIG. 4 shows a specific example. The two materials are dispersed independently, and the space between them is coated with a binder resin. The binder resin to fix the two materials, i.e., the F material and S material, is preferably selected as a resin exhibiting solubility to the coating liquid. This is because it is desired for the binder to dissolve and cover the two materials as if it were fibers that are entangled around the two materials. More specifically, if the binder is dispersed in the coating liquid, the bonding efficiency is too low to bond the space between the two materials which are independently dispersed. Thus, when the coat liquid solvent is a water-based solution, a water soluble resin is preferable as the fixing binder resin. As examples of the binder resin, polyvinyl alcohol, polyvinyl pyrrolidone, polyvinyl butyral, and polyacrylamide are preferable. Moreover, since the recording medium comes into contact with the liquid (including ink) at the time of writing an image, it is preferable that the recording layer coat film does not have solubility to the liquid. Therefore, after the coating process, the binder resin is preferably cross-linked.

Moreover, when the binder resin used to fix the F material and the S material exhibits oil resistant elasticity, it is possible to alleviate an increase in the inner stress to the coat film due to the swell of the S material. Therefore, as explained in the aspect (3) of this invention, it is preferable that the recording layer contains the F material and the S material in an independently dispersed state and contains an oil-resistant elastic binder resin to fix the F material and the S material. When the binder resin is oil resistant, it is not swelled even in contact with the oil ink. Moreover, the binder resin having elasticity alleviates an increase in the inner stress to the coat film due to the swell of the S material. In this case, the oil resistant property refers to a state in which a piece of the material of 10 cm×10 cm×1 mm is impregnated in an ink solvent for 24 hours and a volume expansion coefficient of the material is not more than 10%. The degree of elasticity is desirably set in a range suitable for the purpose of the application of the invention. As a specific example of the oil resistant elastic resin, urethane resin or the like is preferable when oil ink is used.

Figure 5A:
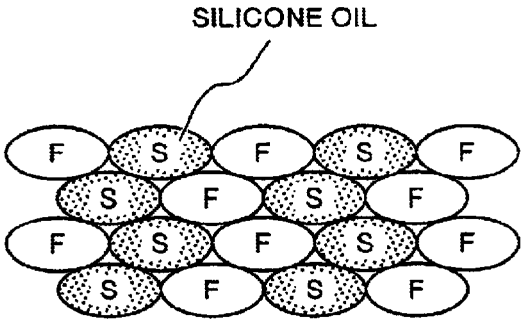
Figure 5B:
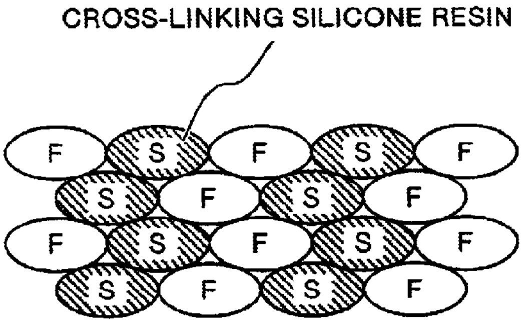

Upon actually producing the recording medium of the present invention, the dispersed state of the F material and the S material varies depending on the difference in the formation methods of the two materials, and gives adverse effects on the characteristics of the recording layer. After extensive studies, the inventors of this invention have found that a preferable recording medium has a construction in which the recording layer contains the material F and an oil-state material having a polyorgano-siloxane structure in a dispersed state, and un-cross-linked organo-siloxane is dispersed in the recording layer, and then cross-linked. By preparing the S material as an oil-state material, the solid-state F material and the oil-state S material are dispersed in an independently separated manner in the coating liquid. After the coating liquid is coated on the substrate and the solvent is evaporated, the S material is dispersed around the solid-state F material without any spaces. Thereafter, the S material is cross-linked and solidified to form a recording layer coat film. FIG. 5A and FIG. 5B are images that show the coat film forming processes. The oil-state S material is preferably in an O/W emulsion form, and the coating liquid is adjusted by mixing the S material emulsion in a water-base solvent prepared by polymerizing the F material in an aqueous system through emulsion polymerization and dispersion polymerization.

Another method of preparing the recording medium will be explained below. With respect to the S material, the heat curing time after the coating process can be reduced in the solid-state S material than in the oil-state S material (because a cross-linking reaction takes place when the S material is oil). Therefore, as explained in the aspect (5) of this invention, it is advantageous that the recording layer contains the F material and a material having a polyorgano-siloxane structure in a dispersed state, and fine particles having the preliminarily cross-linked polyorgano-siloxane structure are dispersed in the recording layer, and then cross-linked with each other.

In the aspects (1) to (5) of this invention, the ratio of the F material to the S material gives influences to the balance of the ink adhesive property to the image section and the ink releasability on the base surface. After extensive studies, as explained in the aspect (6) of this invention, the inventors of this invention have found that a preferable recording medium has the solid content weight ratio of the ink materials that is 4/6 to 6/4.

EXAMPLES

Referring to examples and comparative examples, the present invention will be explained in more detail below.

Example 1

F material: Emulsion polymerization liquid of fluorine-containing acrylate polymer (solid content: 10 wt %)

S material: Silicone resin dispersant (Toray-Dow Corning Silicone, SE1950, solid content: 50 wt %)

Substrate: Polyethylene terephthalate (PET) film (thickness: 100 μm).

A coating liquid was prepared by mixing the F material and the S material at a solid content ratio of 1/1, and the coating liquid was coated on the PET film (solid content thickness: 3 μm) by a wire bar (wire diameter: 0.35 mm), and after having been naturally dried, the coat was subjected to a heat curing process at 160° C. for one minute, thus, a recording medium was obtained.

Comparative Example 1

F material: Emulsion polymerization liquid of fluorine-containing acrylate polymer (solid content: 10 wt %)

Substrate: Polyethylene terephthalate (PET) film (thickness: 100 μm).

Only the F material liquid was coated on the PET film (solid content thickness: 3 μm) by a wire bar (wire diameter: 0.35 mm), and after having been naturally dried, the coat was subjected to the heat curing process at 160° C. for one minute, thus, a recording medium was obtained.

Example 2

F material: Emulsion polymerization liquid of fluorine-containing acrylate polymer (solid content: 10 wt %)

S material: Silicone resin dispersant (Toray-Dow Corning Silicone, BY244, solid content: 50 wt %)

Binder resin: Polyvinyl alcohol (degree of polymerization: 1900, saponification rate: 95%)

Substrate: Polyethylene terephthalate (PET) film (thickness: 100 μm).

The F material liquid and the S material liquid were mixed at a solid content ratio of 1/1 to a solution prepared by dissolving the binder resin of 10 wt % in water to prepare a coating liquid, and the coating liquid was coated on the PET film (solid content thickness: 3 μm) by a wire bar (wire diameter: 0.35 mm), and after having been naturally dried, the coat was subjected to the heat curing process at 160° C. for one minute, thus, a recording medium was obtained.

Comparative Example 2

F material: Emulsion polymerization liquid of fluorine-containing acrylate polymer (solid content: 10 wt %)

Substrate: Polyethylene terephthalate (PET) film (thickness: 100 μm).

Only the F material liquid was coated on the PET film (solid content thickness: 3 μm) by a wire bar (wire diameter: 0.35 mm), and after having been naturally dried, the coat was subjected to the heat curing process at 160° C. for one minute, thus, a recording medium was obtained.

Example 3

F material: Emulsion polymerization liquid of fluorine-containing acrylate polymer (solid content: 10 wt %)

S material: Silicone resin dispersant (Toray-Dow Corning Silicone, SE1950, solid content: 50 wt %)

Oil resistant elastic resin: Aqueous polyurethane resin (solid content: 5 wt %)

Substrate: Polyethylene terephthalate (PET) film (thickness: 100 μm).

A coating liquid was prepared by mixing the F material, the S material and the urethane resin solution at a solid content ratio of 1/1/0.5, and this liquid was coated on the PET film (solid content thickness: 3 μm) by a wire bar (wire diameter 0.35 mm), and after having been naturally dried, the coat was subjected to the heat curing process at 160° C. for one minute, thus, a recording medium was obtained.

Comparative Example 3

F material: Emulsion polymerization liquid of fluorine-containing acrylate polymer (solid content: 10 wt %)

Substrate: Polyethylene terephthalate (PET) film (thickness: 100 μm).

Only the F material liquid was coated on the PET film (solid content thickness: 3 μm) by a wire bar (wire diameter: 0.35 mm), and after having been naturally dried, the coat was subjected to the heat curing process at 160° C. for one minute, thus, a recording medium was obtained.

Example 4

F material: Emulsion polymerization liquid of fluorine-containing acrylate polymer (solid content: 10 wt %)

S material: O/W type silicone oil (Shin-Etsu Chemical Co., Ltd., X52-195, solid content: 40 wt %)

Substrate: Polyethylene terephthalate (PET) film (thickness: 100 μm).

A coating liquid was prepared by mixing the F material and the S material at a solid content ratio of 1/1, and this liquid was coated on the PET film (solid content thickness: 3 μm) by a wire bar (wire diameter: 0.35 mm), and after having been naturally dried, the coat was subjected to the heat curing process at 160° C. for one minute, thus, a recording medium was obtained.

Comparative Example 4

F material: Emulsion polymerization liquid of fluorine-containing acrylate polymer (solid content: 10 wt %)

Substrate: Polyethylene terephthalate (PET) film (thickness: 100 μm).

Only the F material liquid was coated on the PET film (solid content thickness: 3 μm) by a wire bar (wire diameter: 0.35 mm), and after having been naturally dried, the coat was subjected to the heat curing process at 160° C. for one minute, thus, a recording medium was obtained.

Example 5

F material: Emulsion polymerization liquid of fluorine-containing acrylate polymer (solid content: 10 wt %)

S material: Silicone resin dispersant (solid content: 10 wt %)

Substrate: Polyethylene terephthalate (PET) film (thickness 100 μm).

A coating liquid was prepared by mixing the F material and the S material at a solid content ratio of 1/1, and this liquid was coated on the PET film (solid content thickness: 3 μm) by a wire bar (wire diameter 0.35 mm), and after having been naturally dried, the coat was subjected to the heat curing process at 160° C. for one minute, thus, a recording medium was obtained.

Comparative Example 5

F material: Emulsion polymerization liquid of fluorine-containing acrylate polymer (solid content: 10 wt %)

Substrate: Polyethylene terephthalate (PET) film (thickness: 100 μm).

Only the F material liquid was coated on the PET film (solid content thickness: 3 μm) by a wire bar (wire diameter: 0.35 mm), and after having been naturally dried, the coat was subjected to the heat curing process at 160° C. for one minute, thus, a recording medium was obtained.

These first to fifth examples and first to fifth comparative examples were evaluated.

Printing Evaluation:

Ink: Commercially available waterless flat plate ink printing machine: image writing operation by using a commercially available offset printing machine: writing operation by 600 dpi thermal head (according to the writing method shown in FIG. 3B)

Contact liquid: water paper: commercially available coating paper (made by Oji Paper Co., Ltd., NPI DullCoat).

The recording medium with an image written was affixed onto a printing drum of the printing machine, thus, a printing evaluation was carried out. With respect to the number of printed sheets, the first example had 500 sheets, the second example had 1000 sheets, the third to fifth examples had 2000 sheets, and the first to fifth comparative examples had 500 sheets. The results of evaluation are shown in Table 1. As shown in Table 1, it has been found that the first to fifth examples are less susceptible to base surface contamination in comparison with the first to fifth comparative examples.

TABLE 1

| | Solid image section density | Base surface density |
|---|---|---|
| Example 1 | 1.5 | 0.10 |
| Example 2 | 1.6 | 0.10 |
| Example 3 | 1.5 | 0.10 |
| Example 4 | 1.7 | 0.10 |
| Example 5 | 1.5 | 0.10 |
| Comparative Example 1 | 1.5 | 0.14 |
| Comparative Example 2 | 1.5 | 0.14 |
| Comparative Example 3 | 1.5 | 0.14 |
| Comparative Example 4 | 1.5 | 0.14 |
| Comparative Example 5 | 1.5 | 0.14 |

Example 6

F material: Emulsion polymerization liquid of fluorine-containing acrylate polymer (solid content: 10 wt %)

S material: O/W type silicone oil (Shin-Etsu Chemical Co., Ltd., X52-195, solid content: 40 wt %)

Binder resin: Polyvinyl alcohol (solid content: 10 wt %)

Substrate: Polyethylene terephthalate (PET) film (thickness: 100 μm).

Various coating liquids were prepared by mixing the F material and the S material in a range of solid content ratio from 7/3 to 3/7, and each of these liquids was coated on the PET film (solid content thickness: 3 μm) by a wire bar (wire diameter: 0.35 mm), and after having been naturally dried, each coat was subjected to the heat curing process at 160° C. for one minute, thus, a recording medium was obtained and evaluated.

Printing Evaluation:

Ink: Commercially available waterless flat plate ink printing machine: image writing operation by using a commercially available offset printing machine: writing operation by 600 dpi thermal head (according to the writing method shown in FIG. 3B)

Contact liquid: water paper: commercially available coating paper (made by Oji Paper Co., Ltd., NPI DullCoat).

The recording medium with an image written was affixed onto a printing drum of the printing machine, thus, a printing evaluation was carried out. The results of evaluation are shown in Table 2.

TABLE 2

| F material/S material | 7/3 | 6/4 | 5/5 | 4/6 | 3/7 |
|---|---|---|---|---|---|
| Solid image section density | 1.5 | 1.5 | 1.5 | 1.7 | 0.7 |
| Base surface density | 0.14 | 0.12 | 0.11 | 0.10 | 0.10 |

As shown in Table 2, the rate of the F material to the S material that provides a high image density and is less susceptible to base surface contamination is preferably set in the range of 6/4 to 4/6 in the solid content ratio.

According to one aspect of this invention, the device is made less susceptible to base surface contamination, and it is thereby possible to improve the image quality.

According to another aspect of this invention, the mechanical strength of the recording layer coat film is improved as compared to that of the above-mentioned aspect, and it is thereby possible to improve the durability to printing processes.

According to still another aspect of this invention, the oil resistant property to the oil ink is improved, and it is thereby possible to improve the durability to printing processes.

According to still another aspect of this invention, silicone is formed into an oil state, and it is thereby possible to provide a superior dispersing property at the time of coating, and consequently to improve the yield of formation of a desired recording medium.

According to still another aspect of this invention, silicone is provided as solid-state fine particles, and it is thereby possible to provide a superior dispersing property at the time of coating, and a heat curing time is short. Thus, it is possible to improve the yield, and also to shorten the manufacturing time.

According to still another aspect of this invention, an optimal blending ratio is provided between the F material and the S material, and it is thereby possible to stabilize the image quality.

The present document incorporates by reference the entire contents of Japanese priority document, 2001-081891 filed in Japan on Mar. 22, 2001.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A recording medium comprising:

a recording layer having a first material and a second material independently dispersed in said recording layer, wherein said first material has a property that a backward contact angle to a liquid lowers when said material is heated in a state of being in contact with the liquid, and that the value of the backward contact angle recovers when heated in the air; and said second material has a polyorgano-siloxane structure.

2. The recording medium according to claim 1, wherein a ratio of solid content weights of said first and second materials is in a range of 4:6 to 6:4.

3. A recording medium comprising:

a recording layer having a first material and a second material independently dispersed in said recording layer, and a binder resin, wherein said first material has a property that a backward contact angle to a liquid lowers when said material is heated in a state of being in contact with the liquid, and that the value of the backward contact angle recovers when heated in the air;

said second material has a polyorgano-siloxane structure; and said binder resin fixes said first and second material.

4. The recording medium according to claim 3, wherein a ratio of solid content weights of said first and second materials is in a range of 4:6 to 6:4.

5. A recording medium comprising:

a recording layer having a first material and a second material independently dispersed in said recording layer, and an oil resistant elastic binder resin, wherein said first material has a property that a backward contact angle to a liquid lowers when said material is heated in a state of being in contact with the liquid, and that the value of the backward contact angle recovers when heated in the air;

said second material has a polyorgano-siloxane structure; and said oil resistant elastic binder resin fixes said first and second materials.

6. The recording medium according to claim 5, wherein a ratio of solid content weights of said first and second materials is in a range of 4:6 to 6:4.

7. A recording medium comprising:

a recording layer having a first material and a second material independently dispersed in said recording layer, wherein said first material has a property that a backward contact angle to a liquid lowers when said material is heated in a state of being in contact with the liquid, and that the value of the backward contact angle recovers when heated in the air; and said second material is an oil-state material having a polyorgano-siloxane structure, said oil-state material being cross-linked organo-siloxane formed of organo-siloxane that has been dispersed in said recording layer.

8. The recording medium according to claim 7, wherein a ratio of solid content weights of said first and second materials is in a range of 4:6 to 6:4.

9. A recording medium comprising:

a recording layer having a first material and a second material independently dispersed in said recording layer, wherein said first material has a property that a backward contact angle to a liquid lowers when said material is heated in a state of being in contact with the liquid, and that the value of the backward contact angle recovers when heated in the air; and said second material has a polyorgano-siloxane structure, the second material formed of fine particles that are cross-linked to each other, the fine particles having a preliminarily cross-linked polyorgano-siloxane structure and having been dispersed in said recording layer.

10. The recording medium according to claim 9, wherein a ratio of solid content weights of said first and second materials is in a range of 4:6 to 6:4.

* * * * *